United States Patent
Tak et al.

(10) Patent No.: US 8,946,773 B2
(45) Date of Patent: Feb. 3, 2015

(54) MULTI-LAYER SEMICONDUCTOR BUFFER STRUCTURE, SEMICONDUCTOR DEVICE AND METHOD OF MANUFACTURING THE SEMICONDUCTOR DEVICE USING THE MULTI-LAYER SEMICONDUCTOR BUFFER STRUCTURE

(71) Applicant: Samsung Electronics Co., Ltd., Suwon-Si, Gyeonggi-Do (KR)

(72) Inventors: Young-jo Tak, Hwaseong-si (KR); Jae-kyun Kim, Hwaseong-si (KR); Joo-sung Kim, Seongnam-si (KR); Jun-youn Kim, Hwaseong-si (KR); Jae-won Lee, Seoul (KR); Hyo-ji Choi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/835,704

(22) Filed: Mar. 15, 2013

(65) Prior Publication Data
US 2014/0042492 A1 Feb. 13, 2014

(30) Foreign Application Priority Data
Aug. 9, 2012 (KR) ........................ 10-2012-0087350

(51) Int. Cl.
*H01L 29/267* (2006.01)
*H01L 21/02* (2006.01)
*H01L 29/20* (2006.01)

(52) U.S. Cl.
CPC ........ *H01L 29/267* (2013.01); *H01L 21/02104* (2013.01); *H01L 29/2003* (2013.01);
(Continued)

(58) Field of Classification Search
CPC .............. H01L 29/267; H01L 29/2003; H01L 21/02381
USPC ........................................ 257/190, 80, 18, 22
See application file for complete search history.

(56) References Cited

U.S. PATENT DOCUMENTS 6,110,277 A * 8/2000 Braun ............................. 117/94
6,489,639 B1 * 12/2002 Hoke et al. .................... 257/194
(Continued)

FOREIGN PATENT DOCUMENTS

DE 10 2004 038573 A1 3/2006
EP 2434532 A1 3/2012
(Continued)

OTHER PUBLICATIONS

Extended European Search Report dated Jan. 24, 2014, issued in European Application No. 13179953.8.
(Continued)

*Primary Examiner* — Nathan Ha
(74) *Attorney, Agent, or Firm* — Harness, Dickey & Pierce, P.L.C.

(57) ABSTRACT

A semiconductor buffer structure may include a silicon substrate and a buffer layer that is formed on the silicon substrate. The buffer layer may include a first layer, a second layer formed on the first layer, and a third layer formed on the second layer. The first layer may include $Al_xIn_yGa_{1-x-y}N$ ($0 \leq x \leq 1$, $0 \leq y \leq 1$, $0 \leq x+y \leq 1$) and have a lattice constant LP1 that is smaller than a lattice constant LP0 of the silicon substrate. The second layer may include $Al_xIn_yGa_{1-x-y}N$ ($0 \leq x < 1$, $0 \leq y < 1$, $0 \leq x+y < 1$) and have a lattice constant LP2 that is greater than the lattice constant LP1 and smaller than the lattice constant LP0. The third layer may include $Al_xIn_yGa_{1-x-y}N$ ($0 \leq x < 1$, $0 \leq y < 1$, $0 \leq x+y < 1$) and have a lattice constant LP3 that is greater than the lattice constant LP1 and smaller than the lattice constant LP2.

31 Claims, 14 Drawing Sheets

(52) U.S. Cl.
CPC .... *H01L21/02381* (2013.01); *H01L 21/02458* (2013.01); *H01L 21/02505* (2013.01); *H01L 21/02507* (2013.01); *H01L 21/0251* (2013.01); *H01L 21/0254* (2013.01)
USPC .......................................................... 257/190

(56) References Cited

U.S. PATENT DOCUMENTS

| | | | |
|---|---|---|---|
| 6,649,287 B2 * | 11/2003 | Weeks et al. | 428/698 |
| 6,979,844 B2 | 12/2005 | Moku et al. | |
| 7,115,896 B2 | 10/2006 | Guo et al. | |
| 7,598,108 B2 * | 10/2009 | Li et al. | 438/48 |
| 7,687,888 B2 | 3/2010 | Marchand et al. | |
| 8,513,643 B2 * | 8/2013 | Chua et al. | 257/13 |
| 8,592,862 B2 * | 11/2013 | Weeks et al. | 257/183 |
| 2004/0195562 A1 * | 10/2004 | Munns | 257/1 |
| 2005/0110043 A1 | 5/2005 | Otsuka et al. | |
| 2010/0163848 A1 * | 7/2010 | Majhi et al. | 257/24 |
| 2010/0237387 A1 | 9/2010 | Sato | |
| 2010/0244096 A1 | 9/2010 | Sato | |
| 2013/0307024 A1 * | 11/2013 | Kokawa et al. | 257/190 |
| 2013/0328106 A1 * | 12/2013 | Kokawa et al. | 257/190 |

FOREIGN PATENT DOCUMENTS

| | | |
|---|---|---|
| EP | 2602810 A1 | 6/2013 |
| JP | 4-73930 | 3/1992 |
| JP | 2012015306 A | 1/2012 |
| KR | 20060112228 A | 10/2006 |
| KR | 0758124 B1 | 9/2007 |
| KR | 2010-0024944 A | 3/2010 |
| WO | WO-2007/096405 A1 | 8/2007 |
| WO | WO-2011/039181 A1 | 4/2011 |

OTHER PUBLICATIONS

Smet, et al., "Selecting Conversion Phosphors for White Light-Emitting Diodes", Journal of The Electrochemical Society, vol. 158, No. 6, Apr. 4, 2011, pp. R37-R54.

Partial European Search Report dated Sep. 30, 2013 issued in corresponding European Application No. 13179953.8.

* cited by examiner

MULTI-LAYER SEMICONDUCTOR BUFFER STRUCTURE, SEMICONDUCTOR DEVICE AND METHOD OF MANUFACTURING THE SEMICONDUCTOR DEVICE USING THE MULTI-LAYER SEMICONDUCTOR BUFFER STRUCTURE

CROSS-REFERENCE TO RELATED APPLICATION

This application claims priority under 35 U.S.C. §119 to Korean Patent Application No. 10-2012-0087350, filed on Aug. 9, 2012 in the Korean Intellectual Property Office, the disclosure of which is incorporated herein in its entirety by reference.

BACKGROUND

1. Field

The present disclosure relates to a semiconductor buffer structure, a semiconductor device and method of manufacturing the semiconductor device using the semiconductor buffer structure.

2. Description of the Related Art

Conventional nitride-based semiconductor devices use a sapphire substrate. However, a sapphire substrate is relatively expensive. A sapphire substrate is also relatively difficult to manufacture into chips and has a relatively low electric conductivity. Furthermore, a sapphire substrate may not be easily manufactured into a relatively large size due to its tendency to warp at relatively high temperatures (e.g., during epitaxial growth) due to its relatively low thermal conductivity. In order to prevent the above problems, nitride-based semiconductor devices using a silicon (Si) substrate instead of a sapphire substrate have been developed. Since a Si substrate has a higher thermal conductivity than a sapphire substrate, the Si substrate is not as likely to warp at the higher temperatures used for growing a nitride thin film, thereby making it possible to grow a relatively large thin film on the Si substrate. However, when a nitride thin film is grown on a Si substrate, a dislocation density may be increased due to a mismatch in lattice constants between the Si substrate and the nitride thin film. Consequently, cracks may occur due to the tensile stress generated by the mismatch in thermal expansion coefficients between the Si substrate and the nitride thin film. Accordingly, many types of buffer structures have been studied in an attempt to grow nitride thin films, which have relatively high crystallinity and no cracks, on a Si substrate.

SUMMARY

Various example embodiments relate to a semiconductor buffer structure for reducing or preventing cracks in a nitride-based semiconductor thin film, and a semiconductor device including the semiconductor buffer structure.

According to example embodiments, a semiconductor buffer structure may include a silicon substrate; and a buffer layer that is formed on the silicon substrate. The buffer layer may include a first layer, a second layer, and a third layer, wherein the first layer includes $Al_xIn_yGa_{1-x-y}N$ ($0 \leq x \leq 1$, $0 \leq y \leq 1$, $0 \leq x+y \leq 1$) and has a lattice constant LP1 that is smaller than a lattice constant LP0 of the silicon substrate, wherein the second layer is formed on the first layer, includes $Al_xIn_yGa_{1-x-y}N$ ($0 \leq x < 1$, $0 \leq y < 1$, $0 \leq x+y < 1$), and has a lattice constant LP2 that is greater than the lattice constant LP1 and is smaller than the lattice constant LP0, and wherein the third layer is formed on the second layer, includes $Al_xIn_yGa_{1-x-y}N$ ($0 \leq x < 1$, $0 \leq y < 1$, $0 \leq x+y < 1$), and has a lattice constant LP3 that is greater than the lattice constant LP1 and is smaller than the lattice constant LP2.

The buffer layer may further include a fourth layer that is formed on the third layer, includes $Al_xIn_yGa_{1-x-y}N$ ($0 \leq x < 1$, $0 \leq y < 1$, $0 \leq x+y < 1$), and has a lattice constant LP4 that is greater than the lattice constant LP2.

The buffer layer may further include a fifth layer that is formed on the fourth layer, includes $Al_xIn_yGa_{1-x-y}N$ ($0 \leq x < 1$, $0 \leq y < 1$, $0 \leq x+y < 1$), and has a lattice constant LP5 that is greater than the lattice constant LP3 and is smaller than the lattice constant LP4.

The second layer and the fourth layer may have the same thickness, the third layer and the fifth layer may have the same thickness, and the thickness of the third layer may be smaller than the thickness of the second layer.

Alternatively, the second layer and the fourth layer may have the same thickness, the third layer and the fifth layer may have the same thickness, and the thickness of the third layer may be greater than the thickness of the second layer.

The buffer layer may further include a plurality of layers that are formed of a material including $Al_xIn_yGa_{1-x-y}N$ ($0 \leq x < 1$, $0 \leq y < 1$, $0 \leq x+y < 1$) on the third layer. A lattice constant of each of the plurality of layers may be greater than the lattice constant LP3, and the plurality of layers may be sequentially stacked in an order in which a lattice constant of each layer increases with increasing distance from the third layer.

At least one of a plurality of layers included in the buffer layer may have a superlattice structure layer obtained by alternately stacking two layers having different lattice constants.

The two layers having different lattice constants may have different thicknesses in the superlattice structure layer.

At least one of a plurality of layers included in the buffer layer may be in a form of a single layer.

The single layer may have a lattice constant that is constant along a thickness direction of the single layer.

Alternatively, the single layer may have a lattice constant that varies along a thickness direction of the single layer.

The first layer may directly contact the silicon substrate and be formed of AlN.

According to example embodiments, a semiconductor buffer structure may also include a silicon substrate; and a buffer layer that is formed on the silicon substrate. The buffer layer may include a first layer, a second layer, and a third layer, wherein the first layer includes $Al_xIn_yGa_{1-x-y}N$ ($0 \leq x \leq 1$, $0 \leq y \leq 1$, $0 \leq x+y \leq 1$) and has a lattice constant LP1 that is smaller than a lattice constant LP0 of the silicon substrate, wherein the second layer is formed on the first layer, includes $Al_xIn_yGa_{1-x-y}N$ ($0 \leq x < 1$, $0 \leq y < 1$, $0 \leq x+y < 1$), and has a lattice constant distribution that increases along a thickness direction of the second layer away from the first layer, and wherein the third layer includes $Al_xIn_yGa_{1-x-y}N$ ($0 \leq x < 1$, $0 \leq y < 1$, $0 \leq x+y < 1$) and has a lattice constant that is smaller than a lattice constant average of the second layer.

The lattice constant distribution of the second layer may increase linearly.

A minimum value of a lattice constant in the lattice constant distribution of the second layer may be greater than or the same as the lattice constant of the first layer.

The lattice constant distribution of the second layer may increase in a step form.

The lattice constant of the third layer may be equal to or greater than the lattice constant of the first layer.

A thickness of the third layer may be smaller than a thickness of the second layer.

The buffer layer may further include a fourth layer that is formed on the third layer, includes $Al_xIn_yGa_{1-x-y}N$ (0≤x<1, 0≤y<1, 0≤x+y<1), and has a lattice constant distribution that increases along a thickness direction of the fourth layer away from the third layer.

The lattice constant distribution of the fourth layer may be the same as the lattice constant distribution of the second layer.

The buffer layer may further include a fifth layer that is formed on the fourth layer, includes $Al_xIn_yGa_{1-x-y}N$ (0≤x<1, 0≤y<1, 0≤x+y<1), and has a smaller lattice constant than a lattice constant average of the fourth layer.

The buffer layer may include a fourth layer that is formed on the third layer, includes $Al_xIn_yGa_{1-x-y}N$ (0≤x<1, 0≤y<1, 0≤x+y<1), and has a lattice constant distribution that increases along a thickness direction of the fourth layer away from the third layer, and a fifth layer that is formed on the fourth layer, includes $Al_xIn_yGa_{1-x-y}N$ (0≤x<1, 0≤y<1, 0≤x+y<1), and has a smaller lattice constant than a lattice constant average of the fourth layer. The fourth layer and fifth layer may be alternately stacked one or more times.

A lattice constant average of the fourth layer may be equal to or greater than a lattice constant average of the second layer, and a lattice constant of the fifth layer may be equal to or greater than a lattice constant of the third layer.

According to example embodiments, a semiconductor device may also include a silicon substrate; a buffer layer that is formed on the silicon substrate; and a nitride semiconductor layer formed on the buffer layer. The buffer layer may include a first layer, a second layer, and a third layer, wherein the first layer includes $Al_xIn_yGa_{1-x-y}N$ (0≤x≤1, 0≤y≤1, 0≤x+y≤1) and has a lattice constant LP1 that is smaller than a lattice constant LP0 of the silicon substrate, wherein the second layer is formed on the first layer, includes $Al_xIn_yGa_{1-x-y}N$ (0≤x<1, 0≤y<1, 0≤x+y<1), and has a lattice constant LP2 that is greater than the lattice constant LP1 and is smaller than the lattice constant LP0, and wherein the third layer is formed on the second layer, includes $Al_xIn_yGa_{1-x-y}N$ (0≤x<1, 0≤y<1, 0≤x+y<1), and has a lattice constant LP3 that is greater than the lattice constant LP1 and is smaller than the lattice constant LP2.

The buffer layer may further include a fourth layer that is formed on the third layer, includes $Al_xIn_yGa_{1-x-y}N$ (0≤x<1, 0≤y<1, 0≤x+y<1), and has a lattice constant LP4 that is greater than the lattice constant LP2.

The buffer layer may further include a fifth layer that is formed on the fourth layer, includes $Al_xIn_yGa_{1-x-y}N$ (0≤x<1, 0≤y<1, 0≤x+y<1), and has a lattice constant LP5 that is greater than the lattice constant LP3 and is smaller than the lattice constant LP4.

The buffer layer may further include at least one layer that is formed of a material including $Al_xIn_yGa_{1-x-y}N$ (0≤x<1, 0≤y<1, 0≤x+y<1) on the third layer. A lattice constant of the at least one layer may be greater than the lattice constant LP3, and the at least one layer may be sequentially stacked in an order in which a lattice constant of the at least one layer increases with increasing distance from the third layer.

An uppermost layer of the buffer layer, which contacts the nitride semiconductor layer, may have a lattice constant that is smaller than a lattice constant of the nitride semiconductor layer.

The buffer layer may apply a compressive stress to the nitride semiconductor layer.

The semiconductor device may further include a device layer formed on the nitride semiconductor layer.

The device layer may include a light-emitting diode (LED), a laser diode (LD), a field effect transistor (FET), a high electron mobility transistor (HEMT), or a Schottky diode.

According to example embodiments, a semiconductor device may also include a silicon substrate; a buffer layer that is formed on the silicon substrate; and a nitride semiconductor layer formed on the buffer layer. The buffer layer may include a first layer, a second layer, and a third layer, wherein the first layer includes $Al_xIn_yGa_{1-x-y}N$ (0≤x≤1, 0≤y≤1, 0≤x+y≤1) and has a lattice constant LP1 that is smaller than a lattice constant LP0 of the silicon substrate, wherein the second layer is formed on the first layer, includes $Al_xIn_yGa_{1-x-y}N$ (0≤x<1, 0≤y<1, 0≤x+y<1), and has a lattice constant distribution that increases along a thickness direction of the second layer away from the first layer, and wherein the third layer includes $Al_xIn_yGa_{1-x-y}N$ (0≤x<1, 0≤y<1, 0≤x+y<1) and has a lattice constant that is smaller than a lattice constant average of the second layer.

The lattice constant distribution of the second layer of the buffer layer may increase linearly or in a step form.

A minimum value of a lattice constant in the lattice constant distribution of the second layer may be greater than the lattice constant of the first layer.

Alternatively, a minimum value of a lattice constant in the lattice constant distribution of the second layer may be the same as the lattice constant of the first layer.

The buffer layer may further include a fourth layer that is formed on the third layer, includes $Al_xIn_yGa_{1-x-y}N$ (0≤x<1, 0≤y<1, 0≤x+y<1), and has a lattice constant distribution that increases in a thickness direction of the fourth layer away from the third layer.

The semiconductor device may further include a device layer formed on the nitride semiconductor layer.

The device layer may include a light-emitting diode (LED), a laser diode (LD), a field effect transistor (FET), a high electron mobility transistor (HEMT), or a Schottky diode.

According to example embodiments, there is provided a method of manufacturing a semiconductor device, the method including: preparing a silicon substrate; forming on the silicon substrate a buffer layer including a first layer that includes $Al_xIn_yGa_{1-x-y}N$ (0≤x≤1, 0≤y≤1, 0≤x+y≤1) and has lattice constant LP1 that is smaller than a lattice constant LP0 of the silicon substrate, a second layer that is formed on the first layer, includes $Al_xIn_yGa_{1-x-y}N$ (0≤x<1, 0≤y<1, 0≤x+y<1), and has a lattice constant LP2 that is greater than the lattice constant LP1 and smaller than the lattice constant LP0; and a third layer that is formed on the second layer, includes $Al_xIn_yGa_{1-x-y}N$ (0≤x<1, 0≤y<1, 0≤x+y<1), and has a lattice constant LP3 that is greater than the lattice constant LP1 and smaller than the lattice constant LP2; and forming a nitride semiconductor layer on the buffer layer.

The method may further include forming a device layer on the nitride semiconductor layer.

The method may further include removing the buffer layer and the silicon substrate.

According to example embodiments, there is provided a method of manufacturing a semiconductor device, the method including: preparing a silicon substrate; forming on the silicon substrate a buffer layer including a first layer that includes $Al_xIn_yGa_{1-x-y}N$ (0≤x≤1, 0≤y≤1, 0≤x+y≤1) and has a lattice constant LP1 that is smaller than a lattice constant LP0 of the silicon substrate, a second layer that is formed on the first layer, includes $Al_xIn_yGa_{1-x-y}N$ (0≤x<1, 0≤y<1, 0≤x+y<1), and has a lattice constant distribution that increases along a thickness direction, and a third layer that is formed on the second layer, includes $Al_xIn_yGa_{1-x-y}N$ ($0 \leq x < 1$, $0 \leq y < 1$, $0 \leq x+y < 1$), and has a lattice constant that is smaller than a lattice constant average of the second layer; and forming a nitride semiconductor layer on the buffer layer.

The method may further include: forming a device layer on the nitride semiconductor layer; and removing the buffer layer and the silicon substrate.

BRIEF DESCRIPTION OF THE DRAWINGS

The above and/or other aspects of example embodiments will become more apparent and appreciated when the following description is taken in conjunction with the accompanying drawings in which.

DETAILED DESCRIPTION

Figure 1:
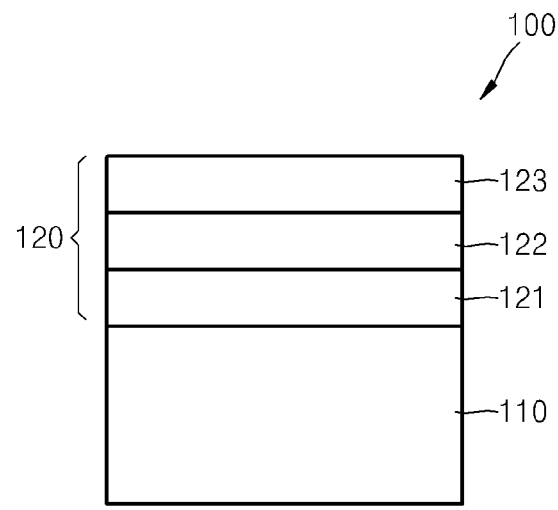
FIG. 1 is a schematic cross-sectional view of a semiconductor buffer structure according to example embodiments.

Hereinafter, various semiconductor buffer structures and semiconductor devices including the semiconductor buffer structures will be described with reference to the attached drawings. In the drawings, the thicknesses of the layers and regions may have been exaggerated for added clarity. It should be understood that the embodiments herein are just examples and may be embodied in many different forms. Expressions such as "at least one of," when preceding a list of elements, modify the entire list of elements.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a semiconductor buffer structure 100 according to example embodiments.

The semiconductor buffer structure 100 may include a silicon substrate 110 and a buffer layer 120 formed on the silicon substrate 110.

The silicon substrate 110 may be a substrate having a Si (111) crystalline surface.

The buffer layer 120 may be used as a stress compensation layer for growing a nitride semiconductor having fewer cracks or defects. The buffer layer 120 may be formed by alternately disposing a plurality of layers having different lattice constant distributions. The buffer layer 120 may be configured to apply a compressive stress, as a whole, to a target layer formed on the buffer layer 120. Stated differently, the buffer layer 120 may provide a net compressive stress to the target layer. The buffer layer 120 may include a plurality of layers formed of $Al_xIn_yGa_{1-x-y}N$ ($0 \leq x \leq 1$, $0 \leq y \leq 1$, $0 \leq x+y \leq 1$). The plurality of layers of the buffer layer 120 may have a composition ratio such that each of the layers has the required or desired lattice constants.

Hereinafter, the term "lattice constant" refers to a constant or a lattice constant distribution. In addition, when the term "lattice constant" is used for an element including a plurality of layers or an element having a lattice constant distribution instead of a constant, the term 'lattice constant' refers to a lattice constant average of the element.

As shown in FIG. 1, the buffer layer 120 includes a first layer 121, a second layer 122, and a third layer 123. The first layer 121 includes $Al_xIn_yGa_{1-x-y}N$ ($0 \leq x \leq 1$, $0 \leq y \leq 1$, $0 \leq x+y \leq 1$) and has a lattice constant LP1 that is smaller than a lattice constant LP0 of the silicon substrate 110. The second layer 122 is formed on the first layer 121. The second layer 122 includes $Al_xIn_yGa_{1-x-y}N$ ($0 \leq x < 1$, $0 \leq y < 1$, $0 \leq x+y < 1$) and has a lattice constant LP2 that is greater than LP1 and smaller than LP0. The third layer 123 is formed on the second layer 122. The third layer 123 includes $Al_xIn_yGa_{1-x-y}N$ ($0 \leq x < 1$, $0 \leq y < 1$, $0 \leq x+y < 1$) and has a lattice constant LP3 that is greater than LP1 and smaller than LP2.

The first layer 121 has a lattice constant LP1 that is smaller than the lattice constant LP0 of the silicon substrate 110 and, thus, may undergo tensile stress. The second layer 122 has a lattice constant LP2 that is greater than the lattice constant LP1 of the first layer 121 and, thus, may undergo compressive stress due to the first layer 121. The third layer 123 has a lattice constant LP3 that is smaller than the lattice constant LP2 of the second layer 122 and, thus, may undergo tensile stress due to the second layer 122. The types of stress applied to the layers may vary according to a relationship between the layer thicknesses in addition to a lattice constant difference with a lower layer. For example, even when a layer has a smaller lattice constant than a lower layer, the layer undergoes tensile stress only if the layer has a thickness that is equal to or more than a critical thickness for strain relaxation, which corresponds to a size of a lattice of the layer, not a lattice of the lower layer. According to this relationship, for example, when the first layer 121 or the third layer 123 is a layer that undergoes tensile stress, if the tensile stress is excessive, cracks may occur. Thus, the first layer 121 or the third layer 123 may be configured to have a thickness that is equal to or less than a critical thickness at which cracks occur during growth or cooling of the first layer 121 or the third layer 123.

In addition, the first layer 121 may be configured to directly contact the silicon substrate 110 and may be formed of AlN. When the first layer 121 is formed of AlN, the lattice constant LP1 at room temperature is about 3.112 Å. In a non-limiting embodiment, the minimum value of the lattice constant LP1 at room temperature may be about 3.112 Å.

The thicknesses and lattice constants of the layers included in the buffer layer 120 may be determined such that the sum of the stresses generated by the layers included in the buffer layer 120 may be a compressive stress. As a result, a compressive stress may be applied to a target layer (e.g., nitride semiconductor layer) formed on the buffer layer 120.

FIGS. 2A through 2D are example structures that can be employed as the individual layers in the buffer layer 120 of the semiconductor buffer structure 100 of FIG. 1.

Figure 2A:
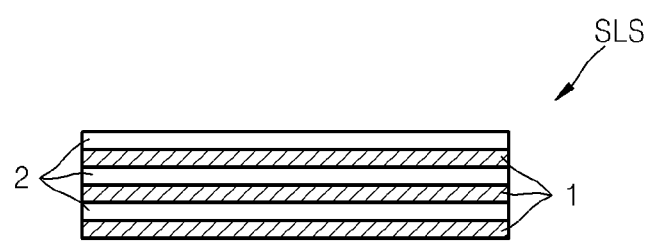
FIGS. 2A through 2D are example structures that can be employed as the individual layers in the buffer layer of the semiconductor buffer structure of FIG. 1.
Figure 2B:
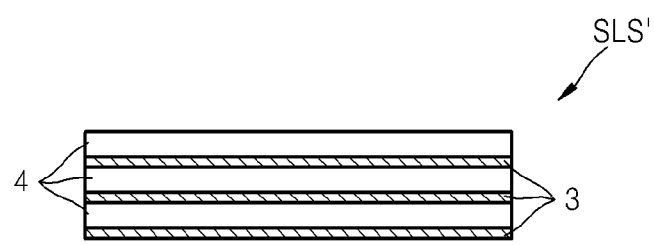

FIGS. 2A and 2B show examples of superlattice structure layers SLS and SLS' that may be used as at least one of the plurality of layers included in the buffer layer 120.

The superlattice structure layer SLS of FIG. 2A is a structure for obtaining a corresponding lattice constant, e.g., a structure that satisfies a lattice constant condition of at least one of the plurality of layers included in the buffer layer 120. The superlattice structure layer SLS is obtained by alternately stacking two layers 1 and 2 having different lattice constants. The two layers 1 and 2 having different lattice constants may have the same thickness. The two layers 1 and 2 may include $Al_xIn_yGa_{1-x-y}N$ ($0 \leq x \leq 1$, $0 \leq y \leq 1$, $0 \leq x+y \leq 1$), and 'x' and 'y' in the two layers 1 and 2 may be determined according to a required or desired lattice constant.

The superlattice structure layer SLS' of FIG. 2B is a structure for obtaining a corresponding lattice constant, e.g., a structure that satisfies a lattice constant condition of at least one of the plurality of layers included in the buffer layer 120. The superlattice structure layer SLS' is obtained by alternately stacking two layers 3 and 4 having different lattice constants. The two layers 3 and 4 having different lattice constants may have different thicknesses. The two layers 3 and 4 may include $Al_xIn_yGa_{1-x-y}N$ ($0 \leq x \leq 1$, $0 \leq y \leq 1$, $0 \leq x+y \leq 1$), and 'x' and 'y' in the two layers 3 and 4 may be determined according to a required or desired lattice constant.

Figure 2C:
Figure 2D:
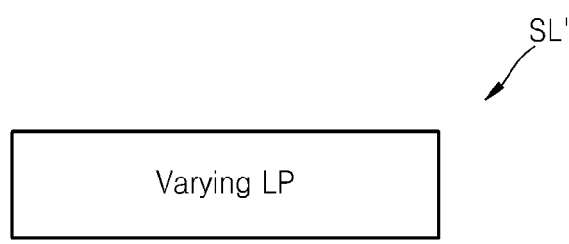

FIGS. 2C and 2D show examples where a required or desired lattice constant (e.g., a lattice constant condition for any one of the plurality of layers included in the buffer layer 120) is obtained by a single layer SL or SL'. In this case, the single layer SL or SL' refers to a single layer in which no physical boundary exists but does not mean that the material composition therein is constant.

The single layer SL of FIG. 2C has a lattice constant that does not vary in a thickness direction of the single layer SL. On the other hand, the single layer SL' of FIG. 2D has a lattice constant that varies in a thickness direction of the single layer SL'.

Although the buffer layer 120 of the semiconductor buffer structure 100 of FIG. 1 is shown as having a three-layered structure, it should be understood that this is just an example. For instance, the semiconductor buffer structure 100 may be modified to be a structure in which layers satisfying the above lattice constant relationship are further alternately stacked.

Figure 3:
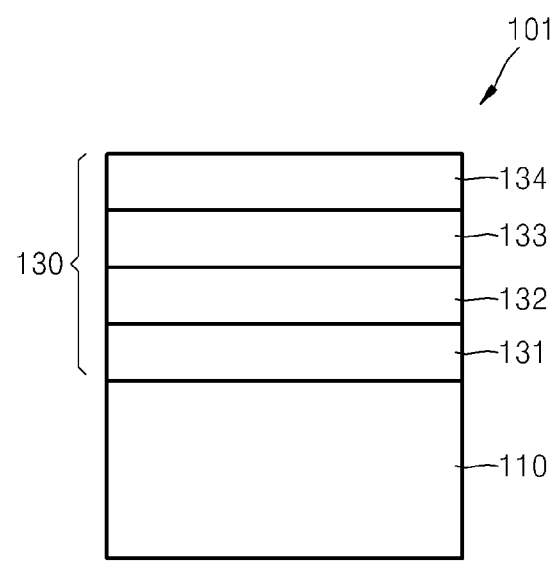
FIG. 3 is a schematic cross-sectional view of another semiconductor buffer structure according to example embodiments.

FIG. 3 is a schematic cross-sectional view of another semiconductor buffer structure 101 according to example embodiments.

A buffer layer 130 of the semiconductor buffer structure 101 of FIG. 3 includes a first layer 131, a second layer 132, and a third layer 133, which may be substantially the same as the first layer 121, the second layer 122, and the third layer 123 of FIG. 1, respectively. Furthermore, the semiconductor buffer structure 101 includes a fourth layer 134 that is formed on the third layer 133. The fourth layer 134 includes $Al_xIn_yGa_{1-x-y}N$ ($0 \leq x<1$, $0 \leq y<1$, $0 \leq x+y<1$) and has a lattice constant LP4 that is greater than a lattice constant LP2 of the second layer 132.

Figure 4:
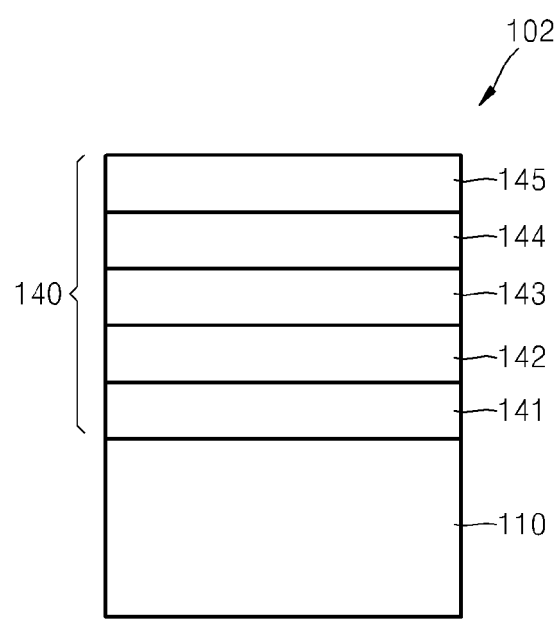
FIG. 4 is a schematic cross-sectional view of another semiconductor buffer structure according to example embodiments.

FIG. 4 is a schematic cross-sectional view of another semiconductor buffer structure 102 according to example embodiments.

A buffer layer 140 of the semiconductor buffer structure 102 of FIG. 4 includes a first layer 141, a second layer 142, and a third layer 143, which may be substantially the same as the first layer 121, the second layer 122, and the third layer 123 of FIG. 1, respectively. Furthermore, the buffer layer 140 includes a fourth layer 144 formed on the third layer 143 as well as a fifth layer 145 formed on the fourth layer 144. The fourth layer 144 includes $Al_xIn_yGa_{1-x-y}N$ ($0 \leq x<1$, $0 \leq y<1$, $0 \leq x+y<1$) and has a lattice constant LP4 that is greater than a lattice constant LP2 of the second layer 142. The fifth layer 145 includes $Al_xIn_yGa_{1-x-y}N$ ($0 \leq x<1$, $0 \leq y<1$, $0 \leq x+y<1$) and has a lattice constant LP5 that is greater than a lattice constant LP3 of the third layer 143 and smaller than the lattice constant LP4 of the fourth layer 144.

Figure 5:
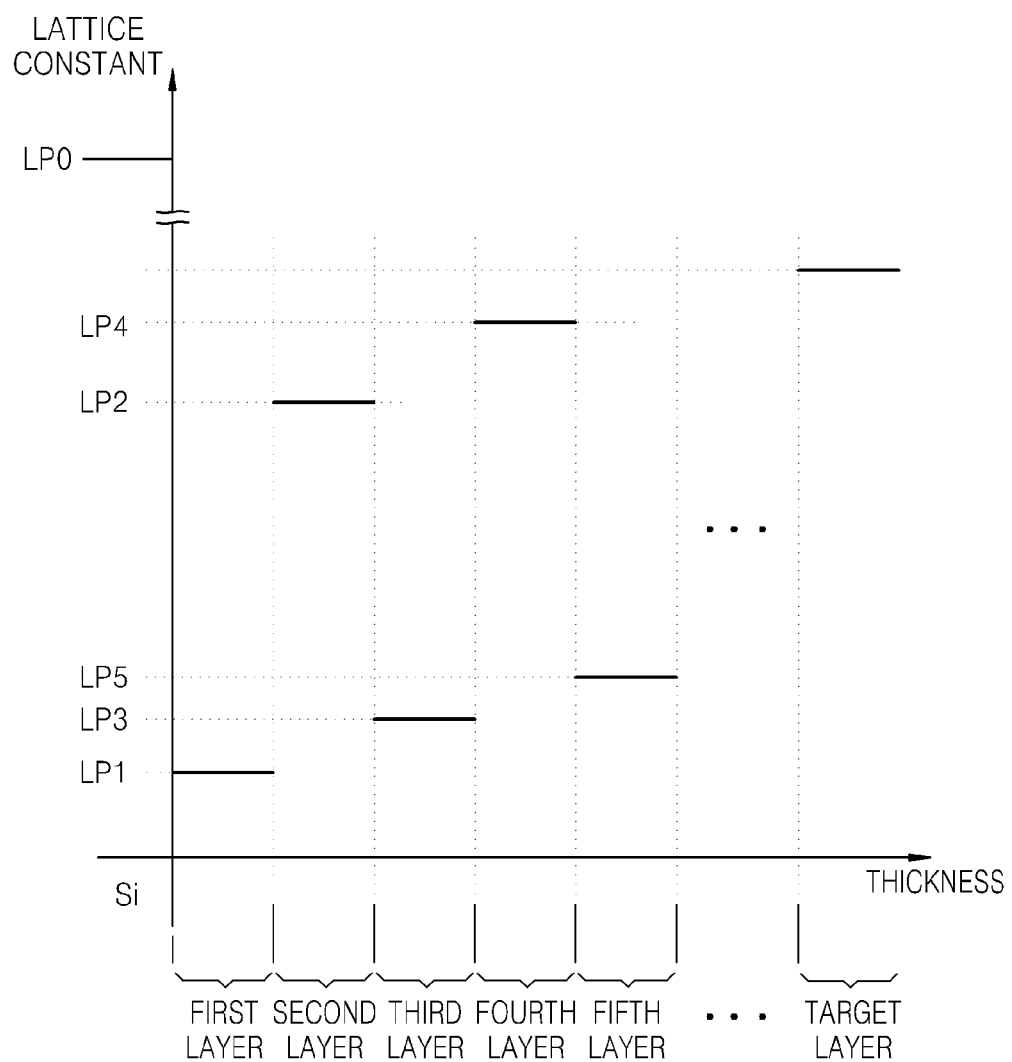
FIG. 5 is a graph of a lattice constant relationship between the layers in the buffer layer of the semiconductor buffer structure of FIG. 1, 3, or 4.

FIG. 5 is a graph of a lattice constant relationship between the layers included in the buffer layer 120, 130, or 140 of the semiconductor buffer structure 100, 101, or 102 of FIG. 1, 3, or 4, respectively.

The buffer layer 120, 130, or 140 may include a plurality of layers that satisfy the lattice constant relationship shown in FIG. 5 and may include five layers or less. Alternatively, the buffer layer 120, 130, or 140 may include five layers or more. The uppermost layer of the buffer layer 120, 130, or 140 may have a lattice constant that is smaller than that of a desired target layer, for example, a nitride semiconductor layer. In a non-limiting embodiment, the target layer may be formed of GaN with a lattice constant LPT of about 3.187 Å at room temperature.

Each layer of the buffer layer 120, 130, or 140 may have one of the structures shown in FIGS. 2A through 2D.

Figure 6:
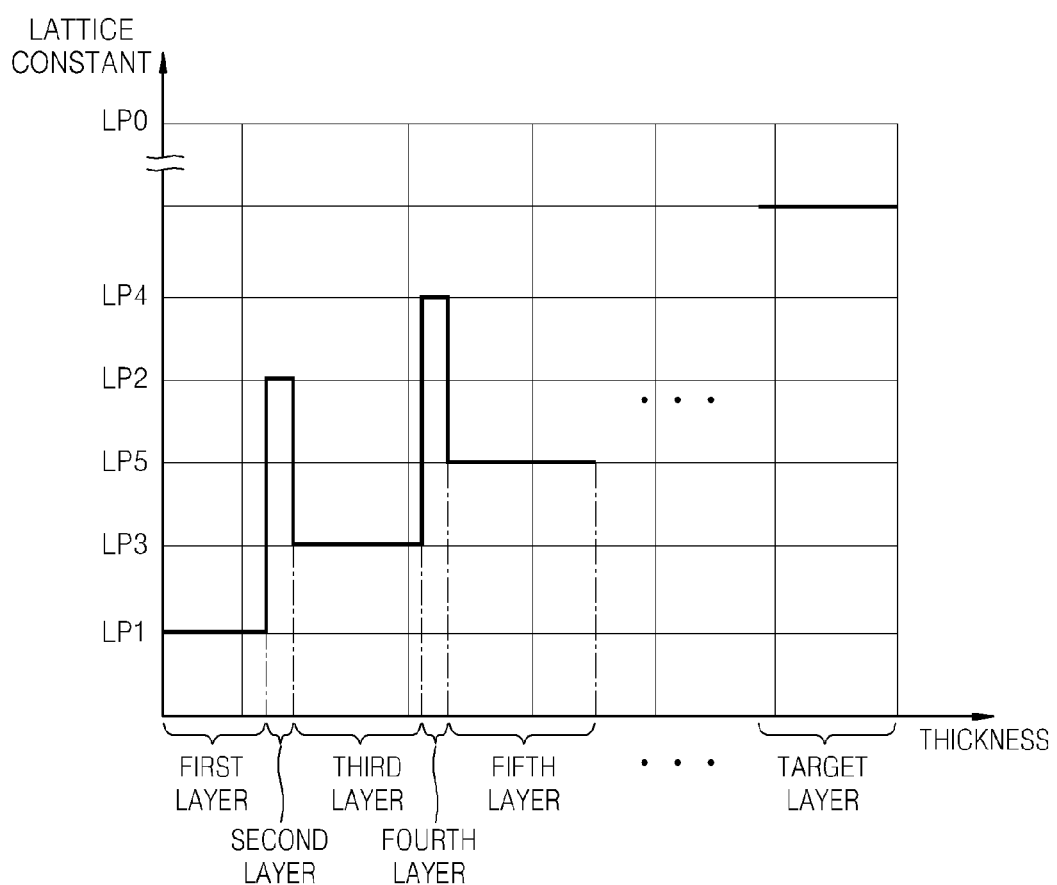
FIG. 6 is a graph of combinations of thicknesses and lattice constants of the layers in the buffer layer of the semiconductor buffer structure of FIG. 1, 3, or 4.
Figure 7:
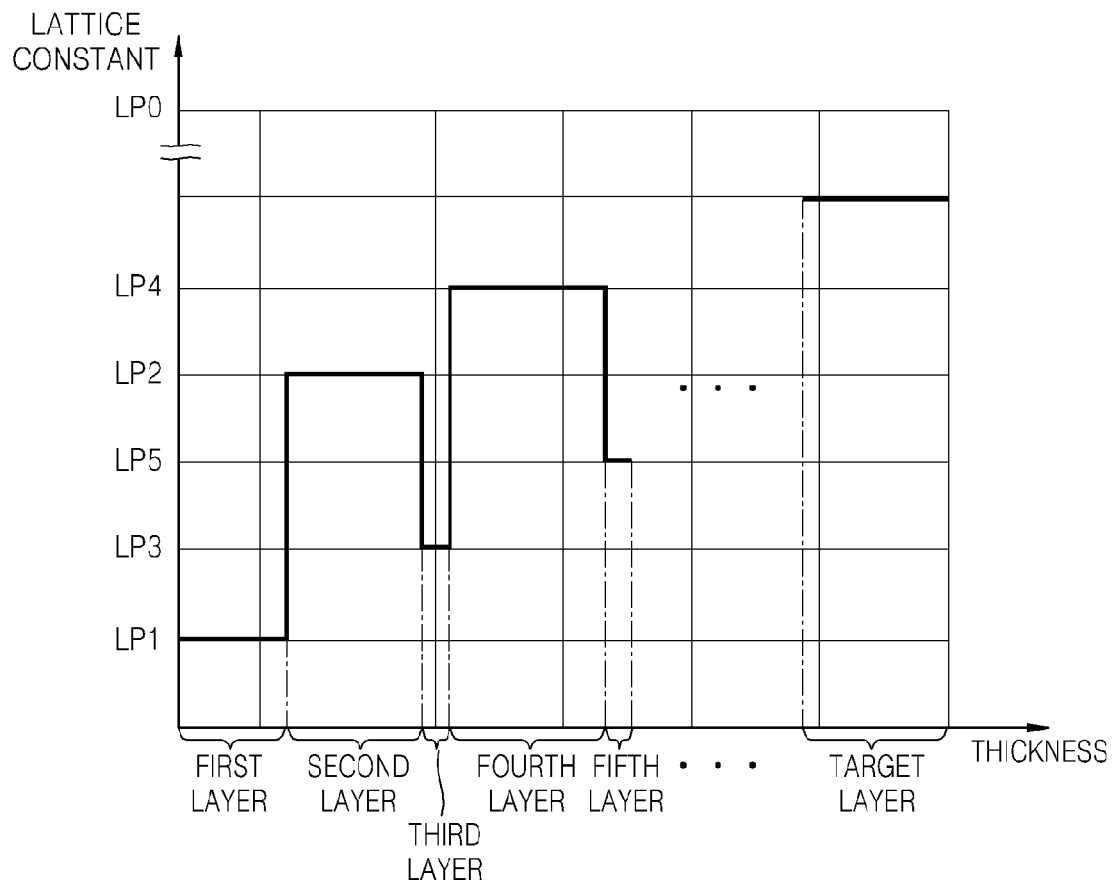
FIG. 7 is another graph of combinations of thicknesses and lattice constants of the layers in the buffer layer of the semiconductor buffer structure of FIG. 1, 3, or 4.

FIGS. 6 and 7 are graphs of combinations of thicknesses and lattice constants of layers included in the buffer layer 120, 130, or 140 of the semiconductor buffer structure 100, 101, or 102 of FIG. 1, 3, or 4, respectively.

Referring to FIG. 6, a second layer and a fourth layer may have the same thickness, a third layer and a fifth layer may have the same thickness, and the thickness of the third layer may be greater than the thickness of the second layer. Under this thickness distribution, tensile stress is not applied to the third layer and the fifth layer, despite having smaller lattice constants than their respective lower layers. The thickness of a lower layer having a greater lattice constant (e.g., the second layer or the fourth layer) may be smaller than a critical size such that tensile stress is not applied to an upper layer having a smaller lattice constant (e.g., the third layer or the fifth layer). Since the upper layer having a smaller lattice constant is not likely to crack from tensile stress, the thickness of an upper layer may be greater than a lower layer.

Referring to FIG. 7, the second layer and the fourth layer may have the same thickness, the third layer and the fifth layer may the same thickness, and the thickness of the third layer may be smaller than the thickness of the second layer. Under this thickness distribution, a lower layer having a greater lattice constant may have a thickness exceeding a critical size such that tensile stress is applied to an upper layer having a smaller lattice constant. The third layer and the fifth layer, which undergo tensile stress, may each have a relatively small thickness so as not to crack during the growth or cooling of the third layer and the fifth layer in a manufacturing process.

Figure 8:
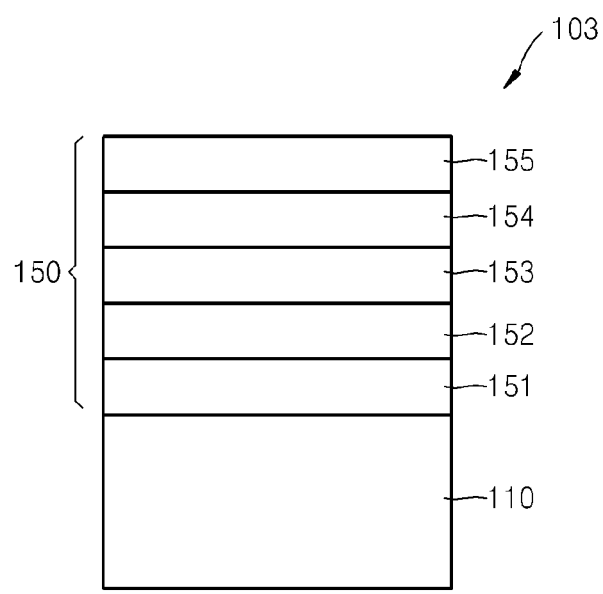
FIG. 8 is a schematic cross-sectional view of another semiconductor buffer structure according to example embodiments.
Figure 9:
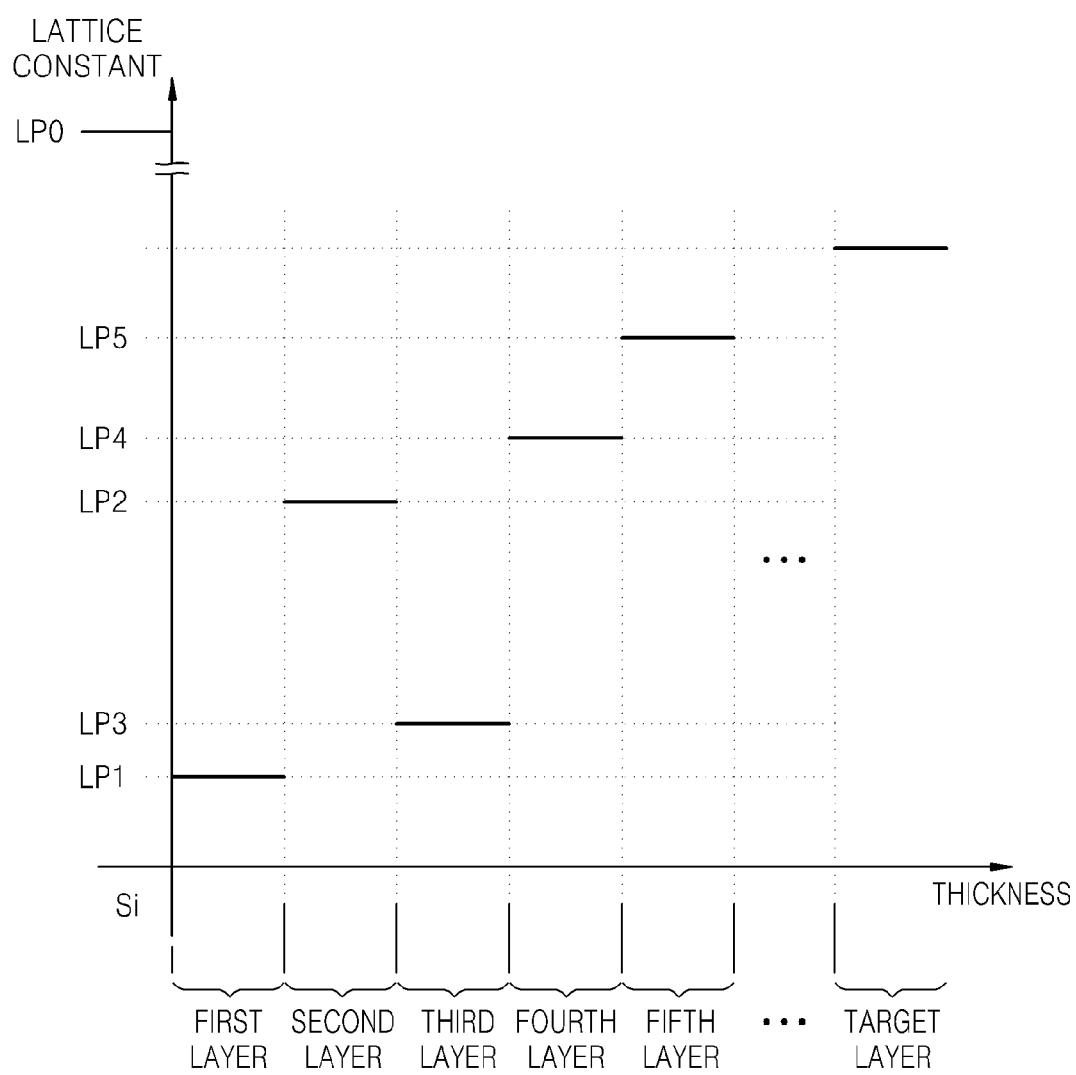
FIG. 9 is a graph of a lattice constant relationship between the layers in the buffer layer of the semiconductor buffer structure of FIG. 8.

FIG. 8 is a schematic cross-sectional view of another semiconductor buffer structure 103 according to example embodiments. FIG. 9 is a graph of a lattice constant relationship between the layers included in a buffer layer 150 of the semiconductor buffer structure 103 of FIG. 8.

The buffer layer 150 of the semiconductor buffer structure 103 includes a first layer 151, a second layer 152, and a third layer 153, which may be substantially the same as the first layer 121, the second layer 122, and the third layer 123 of FIG. 1, respectively. Furthermore, the buffer layer 150 includes a fourth layer 154 and a fifth layer 155 that are formed on the third layer 153. The fourth layer 154 and fifth layer 155 include $Al_xIn_yGa_{1-x-y}N$ ($0 \leq x<1$, $0 \leq y<1$, $0 \leq x+y<1$) and have lattice constants LP4 and LP5, respectively, which are each greater than a lattice constant LP3 of the third layer 153.

As shown in FIG. 9, the lattice constant relationship is obtained by modifying the lattice constant relationship shown in FIG. 5. The semiconductor buffer structure 103 is a structure including a plurality of layers, which is configured such that a lattice constant continually increases after the third layer 153. An uppermost layer of the buffer layer 150 may have a smaller lattice constant than that of a target layer (e.g., nitride semiconductor layer). Each layer of the buffer layer 150 may have one of the structures shown in FIGS. 2A through 2D.

Figure 10:
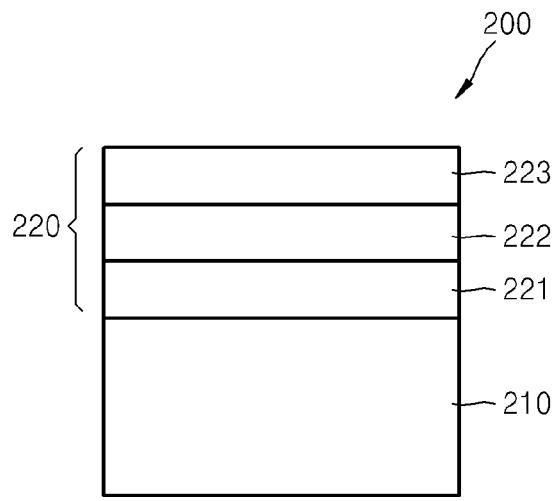
FIG. 10 is a schematic cross-sectional view of another semiconductor buffer structure according to example embodiments.

FIG. 10 is a schematic cross-sectional view of another semiconductor buffer structure 200 according to example embodiments.

Referring to FIG. 10, the semiconductor buffer structure 200 includes a silicon substrate 210 and a buffer layer 220. The buffer layer 220 includes a first layer 221, a second layer 222, and a third layer 223, which are sequentially formed on the silicon substrate 210. The first layer 221 includes $Al_xIn_yGa_{1-x-y}N$ ($0 \leq x \leq 1$, $0 \leq y \leq 1$, $0 \leq x+y \leq 1$) and has a lattice constant LP1 that is smaller than a lattice constant LP0 of the silicon substrate 210. The second layer 222 is formed on the first layer 221, includes $Al_xIn_yGa_{1-x-y}N$ ($0 \leq x \leq 1$, $0 \leq y \leq 1$, $0 \leq x+y \leq 1$), and has a lattice constant distribution $LP2_d$ that increases in a thickness direction of the second layer 222. The third layer 223 is formed on the second layer 222, includes $Al_xIn_yGa_{1-x-y}N$ ($0 \leq x \leq 1$, $0 \leq y \leq 1$, $0 \leq x+y \leq 1$), and has a smaller lattice constant LP3 than a lattice constant average $LP2_a$ of the second layer 222.

Figure 11:
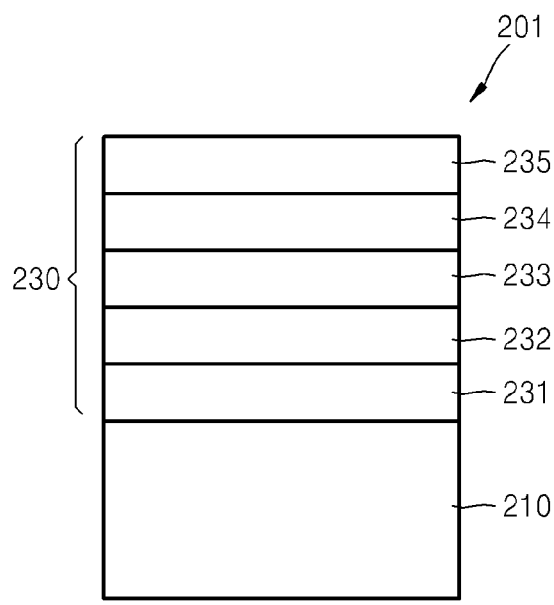
FIG. 11 is a schematic cross-sectional view of another semiconductor buffer structure according to example embodiments.

FIG. 11 is a schematic cross-sectional view of another semiconductor buffer structure 201 according to example embodiments.

A buffer layer 230 of the semiconductor buffer structure 201 of FIG. 11 includes a first layer 231, a second layer 232, and a third layer 233, which may be substantially the same as the first layer 221, the second layer 222, and the third layer 223 of FIG. 10, respectively. Additionally, the buffer layer 230 includes a fourth layer 234 that is formed on the third layer 233. The fourth layer 234 includes $Al_xIn_yGa_{1-x-y}N$ ($0 \leq x \leq 1$, $0 \leq y \leq 1$, $0 \leq x+y \leq 1$) and has a lattice constant distribution $LP4_d$ that increases in a thickness direction of the fourth layer 234. Furthermore, the buffer layer 230 may include a fifth layer 235 that is formed on the fourth layer 234. The fifth layer 235 includes $Al_xIn_yGa_{1-x-y}N$ ($0 \leq x<1$, $0 \leq y<1$, $0 \leq x+y<1$) and has a smaller lattice constant LP5 than a lattice constant average $LP4_a$ of the fourth layer 234.

In FIG. 11, the fourth layer 234 and the fifth layer 235 are shown as being stacked on the third layer 233 only once. However, it should be understood that the fourth layer 234 and the fifth layer 235 may be alternately stacked on the third layer 233 one or more times.

The lattice constant average $LP4_a$ of the fourth layer 234 may be equal to or greater than that of the second layer 232. In addition, a lattice constant LP5 of the fifth layer 235 may be equal to or more than that of the third layer 233.

When the lattice constant of a layer in the buffer layer is represented as $LP_n$, the lattice constant of an adjacent lower layer in the buffer layer may be represented as $LP_{n-1}$ (wherein n=2, 3, 4, 5, 6, 7, 8, 9, 10, etc.). In a non-limiting embodiment, the relationship between $LP_n$ and $LP_{n-1}$ may be described as $(LP_{n-1}-LP_n)/LP_{n-1} \leq 0.024$. Thus, the difference between $LP_{n-1}$ and $LP_n$ may be equal to or less than about 2.4% of $LP_{n-1}$. For example, the difference between $LP_{n-1}$ and $LP_n$ may range from about 0.5% to 2.4%.

Figure 12:
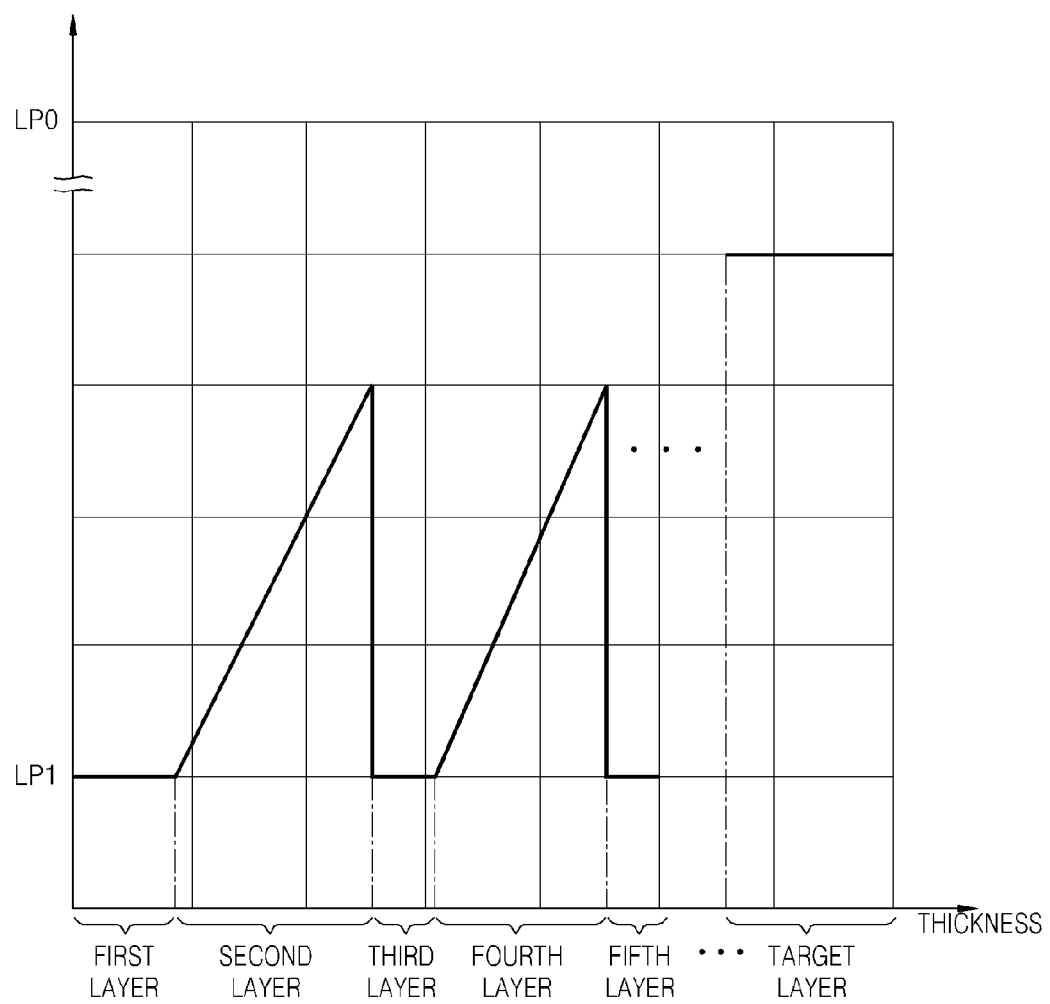
FIGS. 12 through 14 are graphs of combinations of thicknesses and lattice constants of the layers in the buffer layer of the semiconductor buffer structure of FIG. 10 or 11.
Figure 13:
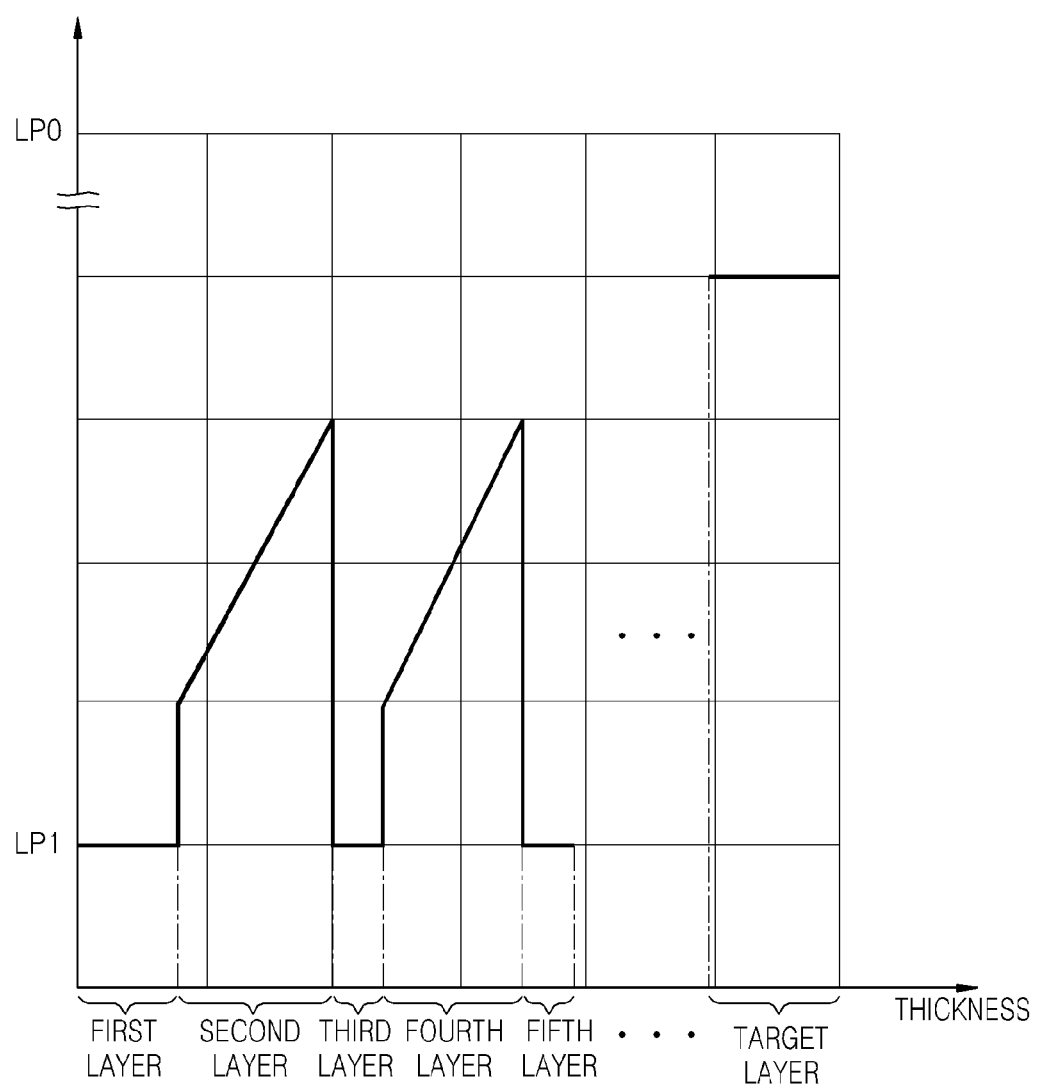
Figure 14:
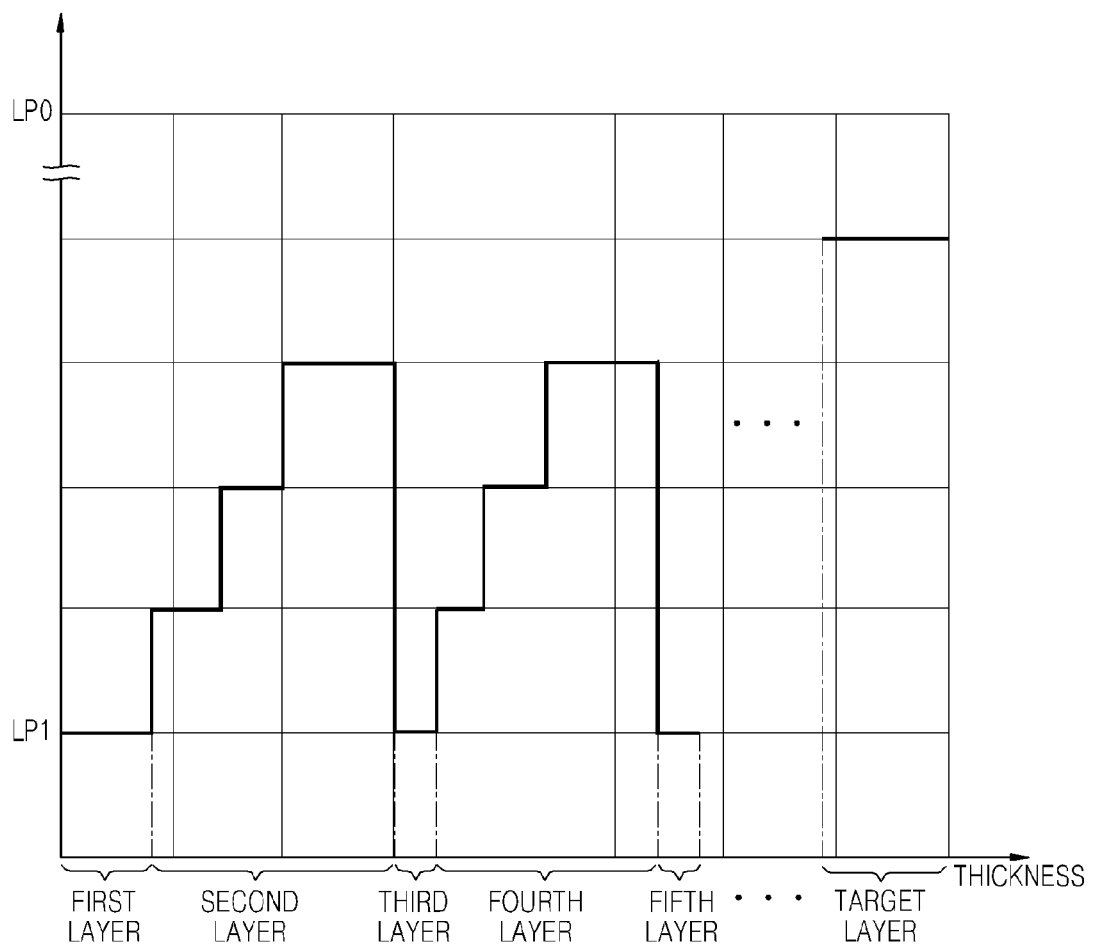

FIGS. 12 through 14 are graphs of combinations of thicknesses and lattice constants of the layers included in the buffer layer 220 or 230 of the semiconductor buffer structure 200 or 201 of FIG. 10 or 11.

Referring to FIGS. 12 and 13, a lattice constant distribution of the second layer and the fourth layer may linearly increase. As shown in FIG. 12, a minimum value of a lattice constant in the lattice constant distribution of the second layer and the fourth layer may be the same as a lattice constant of the first layer. Alternatively, as shown in FIG. 13, the minimum value of the lattice constant in the lattice constant distribution may be greater than the lattice constant of the first layer.

FIGS. 12 and 13 show a case where the lattice constant of the third layer is the same as the lattice constant of the first layer. However, it should be understood that this is just an example. For instance, the lattice constant of the third layer may be greater than the lattice constant of the first layer. In addition, FIGS. 12 and 13 show a case where the lattice constant of the fifth layer is the same as the lattice constant of the third layer. However, it should be understood that this is just an example. For instance, the lattice constant of the fifth layer may be greater than the lattice constant of the third layer.

Referring to FIG. 14, a lattice constant distribution of the second layer and the fourth layer may increase in a step form. As shown in FIG. 14, the lattice constant of the third layer may be the same as that of the first layer. However, it should be understood that example embodiments are not limited thereto. For instance, the lattice constant of the third layer may be greater than that of the first layer.

In FIGS. 12 through 14, since the thickness of the third layer is less than the thickness of the second layer and the lattice constant of the second layer is greater than that of the third layer, the third layer is a layer that undergoes tensile stress. The third layer may have a thickness that is equal to or less than a critical thickness so as not to crack from tensile stress during the manufacture of the semiconductor buffer structure 200 or 201.

FIGS. 12 through 14 show examples where a compressive stress is applied to a target layer by using a combination of layers having different lattice constant distributions, which may be changed in various ways from the structures shown in FIGS. 12 and 14. For example, FIGS. 12 through 14 show a case where the second layer and the fourth layer have the same lattice constant distribution shape. However, it should be understood that example embodiments are not limited thereto. For instance, the second layer and the fourth layer may have lattice constant distributions that linearly increase with different inclinations and/or that increase in step form with different step sizes. Thus, any one of the second layer and the fourth layer may have a lattice constant that linearly increases, while the other one of the second layer and the fourth layer may increase in a step form.

The above-described semiconductor buffer structure may be formed by alternately stacking layers having different lattice constants so as to generate a compressive stress as a whole, thereby compensating for a stress in a target layer formed on the above-described semiconductor buffer structure.

When a nitride semiconductor thin film is grown on the above-described semiconductor buffer structure, since cracks are hindered or prevented from occurring in the nitride semiconductor thin film, a semiconductor device having a relatively large area may be manufactured by using a silicon substrate.

Figure 15:
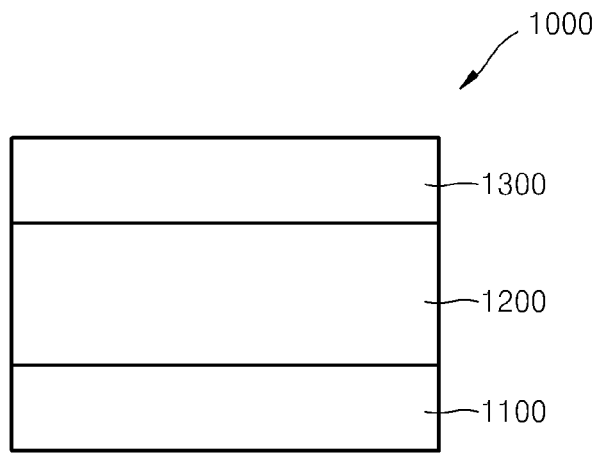
FIG. 15 is a schematic cross-sectional view of a semiconductor device according to example embodiments.

FIG. 15 is a schematic cross-sectional view of a semiconductor device 1000 according to example embodiments.

The semiconductor device 1000 includes a silicon substrate 1100, a buffer layer 1200 formed on the silicon substrate 1100, and a nitride semiconductor layer 1300 formed on the buffer layer 1200.

The semiconductor device 1000 includes the buffer layer 1200 so as to embody a nitride stack structure having few or zero cracks or defects, such as the nitride semiconductor layer 1300 on the silicon substrate 1100. Thus, the semiconductor device 1000 may be manufactured in the form of a wafer having a relatively large area.

When the nitride semiconductor layer 1300 is grown on the silicon substrate 1100, the buffer layer 1200 may compensate for a tensile stress generated due to a thermal expansion coefficient difference. The buffer layer 1200 may be one of the buffer layers 120, 130, 140, 150, 220, and 230 of FIGS. 1 through 14. In addition, a lattice constant of the uppermost layer of the buffer layer 1200 may have a smaller value than a lattice constant of the nitride semiconductor layer 1300 so as to apply a compressive stress to the nitride semiconductor layer 1300.

The nitride semiconductor layer 1300 may have a single-layer structure or a multi-layer structure and may include nitride containing gallium (Ga) and $Al_{x1}In_{y1}Ga_{1-x1-y1}N$ ($0 \leq x1$, $y1 \leq 1$, $x1 \leq y1 < 1$), for example, GaN, InGaN, or AlInGaN. The nitride semiconductor layer 1300 may be undoped or doped.

The silicon substrate 1100 and the buffer layer 1200 may be removed during or after manufacture of the semiconductor device 1000.

The semiconductor device 1000 may be used as a template for a light-emitting diode (LED), a Schottky diode, a laser diode (LD), a field effect transistor (FET), or a high electron mobility transistor (HEMT).

Figure 16:
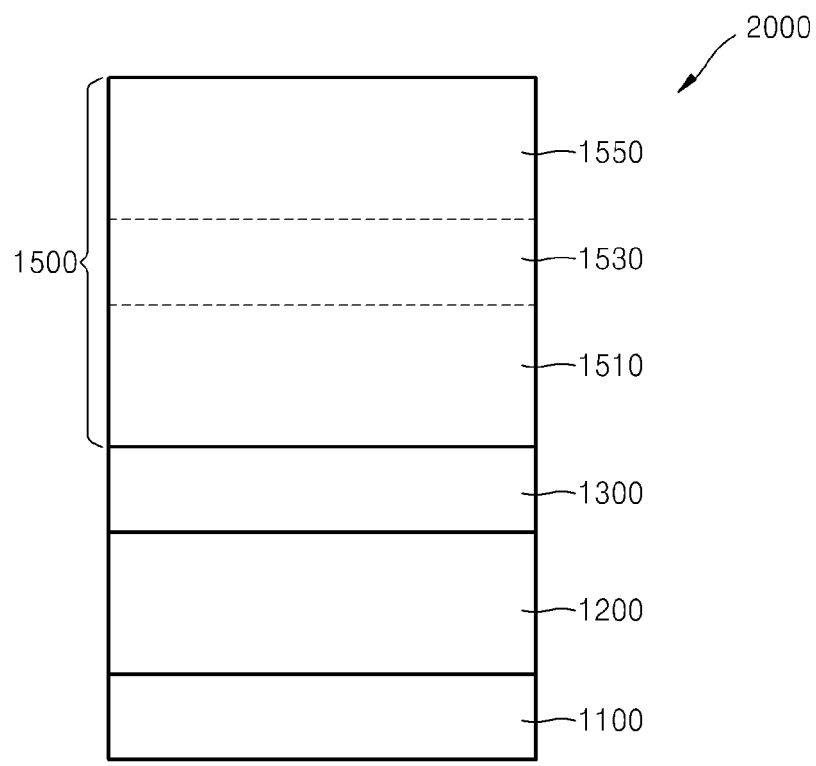
FIG. 16 is a schematic cross-sectional view of another semiconductor device according to example embodiments.

FIG. 16 is a schematic cross-sectional view of another semiconductor device 2000 according to example embodiments.

The semiconductor device 2000 includes the silicon substrate 1100, the buffer layer 1200 formed on the silicon substrate 1100, the nitride semiconductor layer 1300 formed on the buffer layer 1200, and a device layer 1500 formed on the nitride semiconductor layer 1300.

The device layer 1500 includes a first type semiconductor layer 1510, an active layer 1530, and a second type semiconductor layer 1550.

The first type semiconductor layer 1510 is a semiconductor layer doped with first type impurities. For instance, the first type semiconductor layer 1510 may be formed of a group III-V nitride semiconductor material. In a non-limiting embodiment, the first type semiconductor layer 1510 may be formed of a semiconductor material including $Al_xGa_yIn_zN$ ($0 \leq x \leq 1$, $0 \leq y \leq 1$, $0 \leq z \leq 1$, $x+y+z=1$) doped with n-type impurities. Examples of the n-type impurities may include silicon (Si), germanium (Ge), selenium (Se), tellurium (Te), or the like.

The second type semiconductor layer 1550 is a semiconductor layer doped with second type impurities. For instance, the second type semiconductor layer 1550 may be formed of a group III-V nitride semiconductor material. In a non-limiting embodiment, the second type semiconductor layer 1550 may be formed of a semiconductor material including $Al_xGa_yIn_zN$ ($0 \leq x \leq 1$, $0 \leq y \leq 1$, $0 \leq z \leq 1$, $x+y+z=1$) doped with p-type impurities. Examples of the p-type impurities may include magnesium (Mg), zinc (Zn), beryllium (Be), or the like.

The active layer 1530 is a layer that emits light resulting from a combination of electrons and holes. The light is emitted by as much energy corresponding to an energy band gap of the active layer 1530. The active layer 1530 may have a single quantum well structure or a multi quantum well structure, which is formed by periodically changing values x, y, and z of $Al_xGa_yIn_zN$ to adjust a band gap. For example, a quantum well structure may include a pair of a quantum well and a barrier layer having a structure such as InGaN/GaN, InGaN/InGaN, InGaN/AlGaN, or InGaN/InAlGaN. According to a molar fraction of indium (In) in the InGaN layer, the band gap energy may be controlled to adjust a light emitting wavelength band. In general, when a mole fraction of In is changed by as much 1%, a light emitting wavelength is shifted by about 5 nm.

The first type semiconductor layer 1510 and the second type semiconductor layer 1550 may each have a single layer structure or, alternatively, may have a multi-layer structure.

Although the device layer 1500 has been shown and described as a LED structure, it should be understood that example embodiments are not limited thereto. For instance, the device layer 1500 may be in a form of a LD, a FET, an HEMT, or a Schottky diode.

Also, the silicon substrate 1100 and the buffer layer 1200 may be removed when or after a semiconductor device is manufactured.

A method of manufacturing a semiconductor device will be briefly described with reference to FIGS. 17A through 17E.

Figure 17A:
FIGS. 17A through 17E are views for explaining a method of manufacturing a semiconductor device according to example embodiments.
Figure 17B:
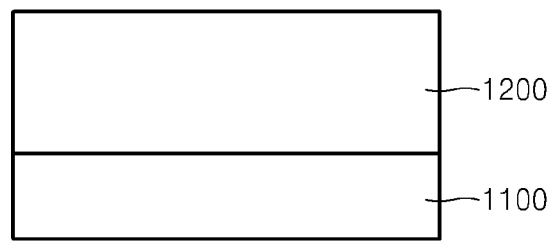

Referring to FIG. 17A, the silicon substrate 1100 is prepared. Referring to FIG. 17B, the buffer layer 1200 is formed on the silicon substrate 1100. The buffer layer 1200 may be any of the buffer layers 120, 130, 140, 150, 220, and 230 of FIGS. 1 through 14.

Figure 17C:
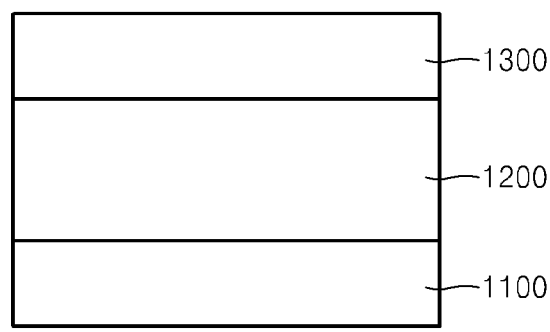

Next, referring to FIG. 17C, the nitride silicon layer 1300 is formed on the buffer layer 1200. The nitride semiconductor layer 1300 may have a single-layer structure or a multi-layer structure and may include nitride containing gallium (Ga) and $Al_{x1}In_{y1}Ga_{1-x1-y1}N$ ($0 \leq x1$, $y1 \leq 1$, $x1+y1 \leq 1$), for example, GaN, InGaN, or AlInGaN. The nitride semiconductor layer 1300 may be undoped or doped.

Figure 17D:
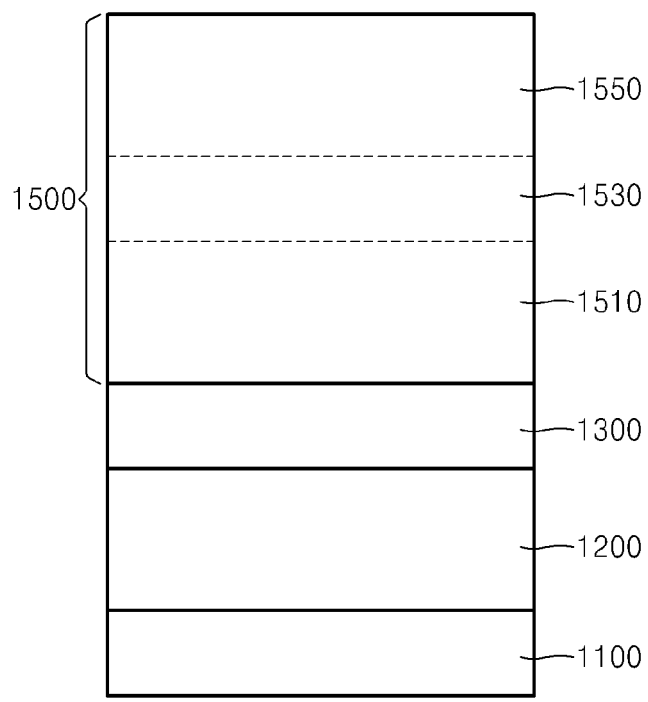

Next, referring to FIG. 17D, the device layer 1400 may be further formed on the nitride semiconductor layer 1300. The device layer 1500 may have an LED structure including the first type semiconductor layer 1510, the active layer 1530, and the second type semiconductor layer 1550. However, the present embodiment is not limited thereto, and the device layer 1500 may have a LD structure, a FET structure, a HEMT structure, or a Schottky diode structure.

Figure 17E:
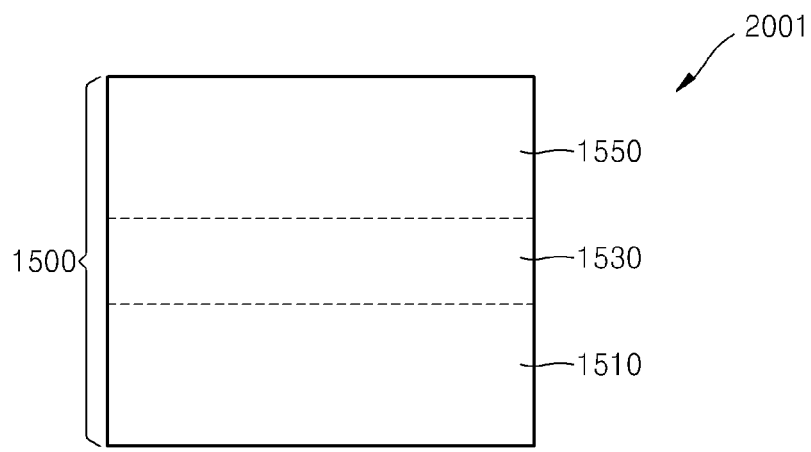

If necessary, the silicon substrate 1100 and the buffer layer 1200 may be removed after the device layer 1400 is formed, thereby manufacturing a semiconductor device 2001 as shown in FIG. 17E.

However, the removing of the silicon substrate 1100 and the buffer layer 1200 does not have to be performed after the device layer 1400 is formed. The silicon substrate 1100 and the buffer layer 1200 may be removed after the nitride semiconductor layer 1300 is formed and before the device layer 1400 is formed. Also, in order to remove the silicon substrate 1100 and the buffer layer 1200, a support substrate (not shown) may be used. For example, the support substrate may be adhered to the nitride semiconductor layer 1300 or the device layer 1400 and then the silicon substrate 1100 and the buffer layer 1200 may be removed.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims. Furthermore, descriptions of features or aspects of a particular embodiment should be understood as being applicable for other similar features or aspects in other embodiments.

What is claimed is:

1. A semiconductor buffer structure comprising:
a silicon substrate; and
a buffer layer on the silicon substrate, the buffer layer including a first layer, a second layer on the first layer, and a third layer on the second layer,
wherein the first layer includes $Al_xIn_yGa_{1-x-y}N$ ($0 \leq x \leq 1$, $0 \leq y \leq 1$, $0 \leq x+y \leq 1$) and has a lattice constant LP1 that is smaller than a lattice constant LP0 of the silicon substrate,
wherein the second layer includes $Al_xIn_yGa_{1-x-y}N$ ($0 \leq x \leq 1$, $0 \leq y \leq 1$, $0 \leq x+y \leq 1$) and has a lattice constant LP2 that is greater than the lattice constant LP1 and smaller than the lattice constant LP0, and
wherein the third layer includes $Al_xIn_yGa_{1-x-y}N$ ($0 \leq x \leq 1$, $0 \leq y \leq 1$, $0 \leq x+y \leq 1$) and has a lattice constant LP3 that is greater than the lattice constant LP1 and smaller than the lattice constant LP2.

2. The semiconductor buffer structure of claim 1, wherein the buffer layer further includes a fourth layer on the third layer, the fourth layer including $Al_xIn_yGa_{1-x-y}N$ ($0 \leq x \leq 1$, $0 \leq y \leq 1$, $0 \leq x+y \leq 1$) and having a lattice constant LP4 that is greater than the lattice constant LP2.

3. The semiconductor buffer structure of claim 2, wherein the buffer layer further includes a fifth layer on the fourth layer, the fifth layer including $Al_xIn_yGa_{1-x-y}N$ ($0 \leq x \leq 1$, $0 \leq y \leq 1$, $0 \leq x+y \leq 1$) and having a lattice constant LP5 that is greater than the lattice constant LP3 and smaller than the lattice constant LP4.

4. The semiconductor buffer structure of claim 3, wherein the second layer and the fourth layer have a same thickness, the third layer and the fifth layer have a same thickness, and the thickness of the third layer is smaller than the thickness of the second layer.

5. The semiconductor buffer structure of claim 3, wherein the second layer and the fourth layer have a same thickness, the third layer and the fifth layer have a same thickness, and the thickness of the third layer is greater than the thickness of the second layer.

6. The semiconductor buffer structure of claim 1, wherein the buffer layer further includes a plurality of layers on the third layer, the plurality of layers including $Al_xIn_yGa_{1-x-y}N$ ($0 \leq x \leq 1$, $0 \leq y \leq 1$, $0 \leq x+y \leq 1$), a lattice constant of each of the plurality of layers being greater than the lattice constant LP3, the plurality of layers being sequentially stacked by increasing lattice constant.

7. The semiconductor buffer structure of claim 1, wherein at least one of the first, second, and third layers has a superlattice structure layer including two alternately stacked layers having different lattice constants.

8. The semiconductor buffer structure of claim 1, wherein at least one of the first, second, and third layers is in a form of a single layer, the single layer having a lattice constant that is constant along a thickness direction of the single layer.

9. The semiconductor buffer structure of claim 1, wherein at least one of the first, second, and third layers is in a form of a single layer, the single layer having a lattice constant that varies along a thickness direction of the single layer.

10. The semiconductor buffer structure of claim 1, wherein the first layer directly contacts the silicon substrate, the first layer being an AlN layer.

11. A semiconductor buffer structure comprising:
a silicon substrate; and
a buffer layer on the silicon substrate, the buffer layer including a first layer, a second layer on the first layer, and a third layer on the second layer,
wherein the first layer includes $Al_xIn_yGa_{1-x-y}N$ ($0 \leq x \leq 1$, $0 \leq y \leq 1$, $0 \leq x+y \leq 1$) and has a lattice constant LP1 that is smaller than a lattice constant LP0 of the silicon substrate,
wherein the second layer includes $Al_xIn_yGa_{1-x-y}N$ ($0 \leq x \leq 1$, $0 \leq y \leq 1$, $0 \leq x+y \leq 1$) and has a lattice constant distribution $LP2_d$ that increases along a thickness direction of the second layer, and
wherein the third layer includes $Al_xIn_yGa_{1-x-y}N$ ($0 \leq x < 1$, $0 \leq y < 1$, $0 \leq x+y < 1$) and has a lattice constant LP3 that is smaller than a lattice constant average $LP2_a$ of the second layer.

12. The semiconductor buffer structure of claim 11, wherein the lattice constant distribution $LP2_d$ of the second layer increases linearly.

13. The semiconductor buffer structure of claim 12, wherein a minimum value of a lattice constant in the lattice constant distribution $LP2_d$ of the second layer is the same as the lattice constant LP1 of the first layer or greater than the lattice constant LP1 of the first layer.

14. The semiconductor buffer structure of claim 11, wherein the lattice constant distribution $LP2_d$ of the second layer increases in a step form.

15. The semiconductor buffer structure of claim 11, wherein the lattice constant LP3 of the third layer is equal to or greater than the lattice constant LP1 of the first layer.

16. The semiconductor buffer structure of claim 11, wherein a thickness of the third layer is smaller than a thickness of the second layer.

17. The semiconductor buffer structure of claim 11, wherein the buffer layer further includes a fourth layer on the third layer, the fourth layer including $Al_xIn_yGa_{1-x-y}N$ ($0 \leq x < 1$, $0 \leq y < 1$, $0 \leq x+y < 1$) and having a lattice constant distribution $LP4_d$ that increases along a thickness direction of the fourth layer.

18. The semiconductor buffer structure of claim 17, wherein the lattice constant distribution $LP4_d$ of the fourth layer is the same as the lattice constant distribution $LP2_d$ of the second layer.

19. The semiconductor buffer structure of claim 17, wherein the buffer layer further includes a fifth layer on the fourth layer, the fifth layer including $Al_xIn_yGa_{1-x-y}N$ ($0 \leq x < 1$, $0 \leq y < 1$, $0 \leq x+y < 1$) and having a smaller lattice constant LP5 than a lattice constant average $LP4_a$ of the fourth layer.

20. The semiconductor buffer structure of claim 11, wherein the buffer layer further includes a fourth layer on the third layer and a fifth layer on the fourth layer, the fourth layer including $Al_xIn_yGa_{1-x-y}N$ ($0 \leq x < 1$, $0 \leq y < 1$, $0 \leq x+y < 1$) and having a lattice constant distribution $LP4_d$ that increases along a thickness direction of the fourth layer, the fifth layer including $Al_xIn_yGa_{1-x-y}N$ ($0 \leq x < 1$, $0 \leq y < 1$, $0 \leq x+y < 1$) and having a smaller lattice constant LP5 than a lattice constant average $LP4_a$ of the fourth layer, the fourth layer and fifth layer being alternately stacked one or more times.

21. The semiconductor buffer structure of claim 20, wherein the lattice constant average $LP4_a$ of the fourth layer is equal to or greater than the lattice constant average $LP2_a$ of the second layer, and a lattice constant LP5 of the fifth layer is equal to or greater than the lattice constant LP3 of the third layer.

22. A semiconductor device comprising:
a silicon substrate;
a buffer layer on the silicon substrate, the buffer layer including a first layer, a second layer on the first layer, and a third layer on the second layer, the first layer including $Al_xIn_yGa_{1-x-y}N$ ($0 \leq x \leq 1$, $0 \leq y \leq 1$, $0 \leq x+y \leq 1$) and having a lattice constant LP1 that is smaller than a lattice constant LP0 of the silicon substrate, the second layer including $Al_xIn_yGa_{1-x-y}N$ ($0 \leq x < 1$, $0 \leq y < 1$, $0 \leq x+y < 1$) and having a lattice constant LP2 that is greater than the lattice constant LP1 and smaller than the lattice constant LP0, and the third layer including $Al_xIn_yGa_{1-x-y}N$ ($0 \leq x < 1$, $0 \leq y < 1$, $0 \leq x+y < 1$) and having a lattice constant LP3 that is greater than the lattice constant LP1 and smaller than the lattice constant LP2; and
a nitride semiconductor layer on the buffer layer.

23. The semiconductor device of claim 22, wherein the buffer layer is structured to apply a compressive stress to the nitride semiconductor layer.

24. The semiconductor device of claim 22, further comprising:
a device layer on the nitride semiconductor layer.

25. The semiconductor device of claim 24, wherein the device layer includes a light-emitting diode (LED), a laser diode (LD), a field effect transistor (FET), a high electron mobility transistor (HEMT), or a Schottky diode.

26. A semiconductor device comprising:
a silicon substrate;
a buffer layer on the silicon substrate, the buffer layer including a first layer, a second layer on the first layer, and a third layer on the second layer, the first layer including $Al_xIn_yGa_{1-x-y}N$ ($0 \leq x \leq 1$, $0 \leq y \leq 1$, $0 \leq x+y \leq 1$) and having a lattice constant LP1 that is smaller than a lattice constant LP0 of the silicon substrate, the second layer including $Al_xIn_yGa_{1-x-y}N$ ($0 \leq x < 1$, $0 \leq y < 1$, $0 \leq x+y < 1$) and having a lattice constant distribution $LP2_d$ that increases along a thickness direction of the second layer, and the third layer including $Al_xIn_yGa_{1-x-y}N$ ($0 \leq x < 1$, $0 \leq y < 1$, $0 \leq x+y < 1$) and having a lattice constant LP3 that is smaller than a lattice constant average $LP2_a$ of the second layer; and
a nitride semiconductor layer on the buffer layer.

27. A method of manufacturing a semiconductor device, the method comprising:
preparing a silicon substrate;
forming on the silicon substrate a buffer layer comprising
a first layer including $Al_xIn_yGa_{1-x-y}N$ ($0 \leq x \leq 1$, $0 \leq y \leq 1$, $0 \leq x+y \leq 1$) and having a lattice constant LP1 that is smaller than a lattice constant LP0 of the silicon substrate,
a second layer that is formed on the first layer, including $Al_xIn_yGa_{1-x-y}N$ ($0 \leq x < 1$, $0 \leq y < 1$, $0 \leq x+y < 1$) and having a lattice constant LP2 that is greater than the lattice constant LP1 and smaller than the lattice constant LP0; and
a third layer that is formed on the second layer, including $Al_xIn_yGa_{1-x-y}N$ ($0 \leq x < 1$, $0 \leq y < 1$, $0 \leq x+y < 1$) and having a lattice constant LP3 that is greater than the lattice constant LP1 and smaller than the lattice constant LP2; and
forming a nitride semiconductor layer on the buffer layer.

28. The method of claim 27, further comprising forming a device layer on the nitride semiconductor layer.

29. The method of claim 28, further comprising removing the buffer layer and the silicon substrate.

30. A method of manufacturing a semiconductor device, the method comprising:

preparing a silicon substrate;

forming on the silicon substrate a buffer layer comprising
a first layer including $Al_xIn_yGa_{1-x-y}N$ ($0 \leq x \leq 1$, $0 \leq y \leq 1$, $0 \leq x+y \leq 1$) and having a lattice constant LP1 that is smaller than a lattice constant LP0 of the silicon substrate, a second layer that is formed on the first layer, including $Al_xIn_yGa_{1-x-y}N$ ($0 \leq x < 1$, $0 \leq y < 1$, $0 \leq x+y < 1$) and having a lattice constant distribution $LP2_d$ that increases along a thickness direction of the second layer, and a third layer that is formed on the second layer, including $Al_xIn_yGa_{1-x-y}N$ ($0 \leq x < 1$, $0 \leq y < 1$, $0 \leq x+y < 1$) and having a lattice constant LP3 that is smaller than a lattice constant average $LP2_a$ of the second layer; and forming a nitride semiconductor layer on the buffer layer.

31. The method of claim 30, further comprising:

forming a device layer on the nitride semiconductor layer; and removing the buffer layer and the silicon substrate.

* * * * *